(12) United States Patent
Mizugaki

(10) Patent No.: US 6,707,745 B2
(45) Date of Patent: Mar. 16, 2004

(54) OPERATION CONTROL ACCORDING TO TEMPERATURE VARIATION IN INTEGRATED CIRCUIT

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/245,586

(22) Filed: Sep. 18, 2002

(65) Prior Publication Data

US 2003/0058016 A1 Mar. 27, 2003

(30) Foreign Application Priority Data

Sep. 21, 2001 (JP) ........................................ 2001-288317

(51) Int. Cl.$^7$ ................................................ G11C 7/00
(52) U.S. Cl. ........................................ 365/222; 365/196
(58) Field of Search .................................. 365/222, 196

(56) References Cited

U.S. PATENT DOCUMENTS 5,396,120 A * 3/1995 Iwasa et al. ................ 327/512

* cited by examiner

Primary Examiner—Michael Tran
(74) Attorney, Agent, or Firm—Oliff & Berridge, PLC

(57) ABSTRACT

A semiconductor memory device, such as a virtual SRAM, includes a temperature detection module and a temperature characteristic regulation module. The temperature detection module has a temperature sensing element, which includes a specific pn junction area set in a cutoff state out of pn junction areas formed on an identical semiconductor substrate with a memory cell array and outputs a leak current running through the specific pn junction area. The temperature detection module detects a temperature change of the semiconductor memory device in response to the leak current output from the temperature sensing element. The temperature characteristic regulation module regulates a generation period of a refresh timing signal, which is used to determine an execution timing of a refreshing operation in the memory cell array, based on a result of the detection by the temperature detection module. This arrangement of the present invention attains a low-consumption level of electric current equivalent to that of a conventional SRAM.

19 Claims, 9 Drawing Sheets

Fig.1

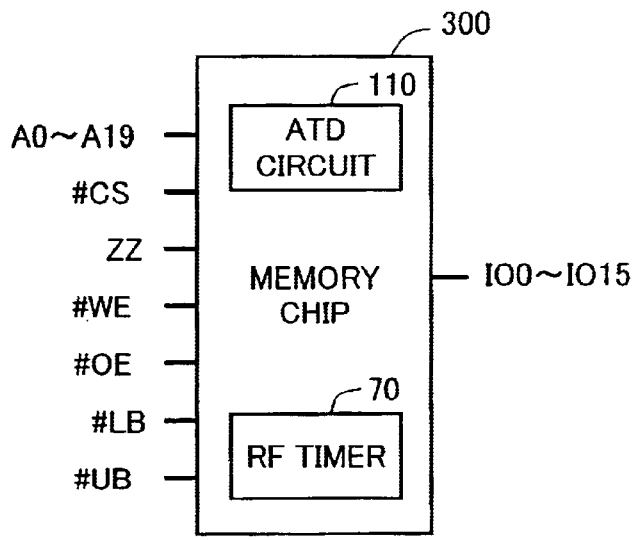

Fig.2

| | #CS | ZZ | REFRESH MODE (Notes) |
|---|---|---|---|
| OPERATION | L | H | MODE 1 |
| STAND-BY | H | H | MODE 1 |
| SNOOZE (POWER DOWN) | H | L | MODE 2 |

(Notes)
Refresh Mode 1: Refreshing is executed synchronously with an ATD signal after generation of a refresh timing signal in a memory chip.
Refresh Mode 2: Refreshing is executed immediately after generation of a refresh timing signal in a memory chip (input of an address is not required).

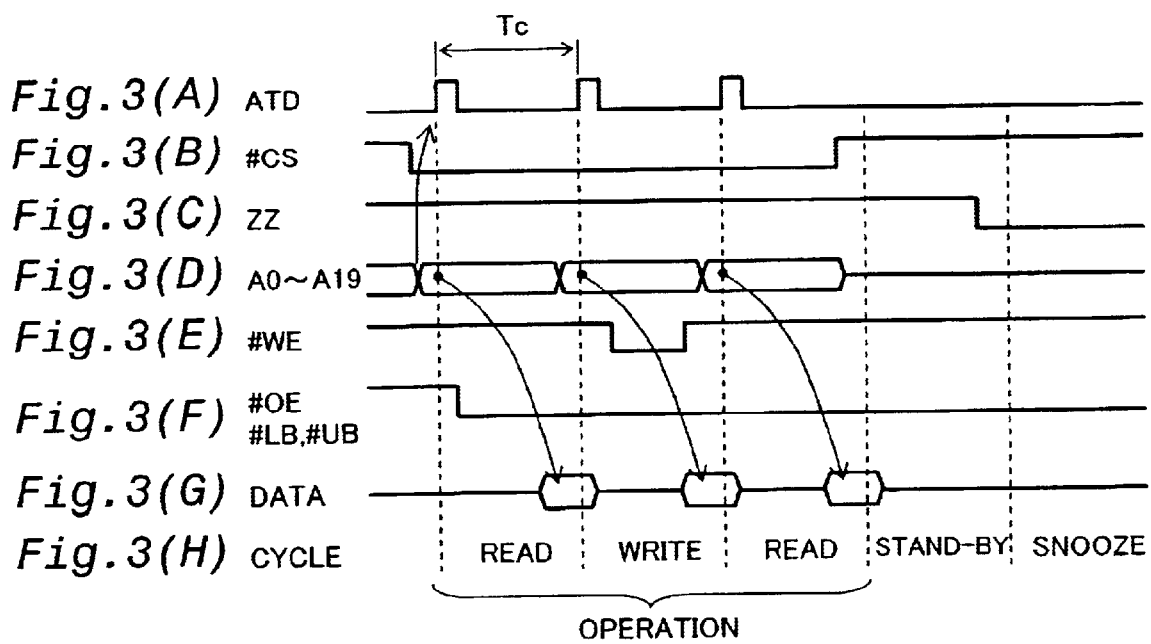

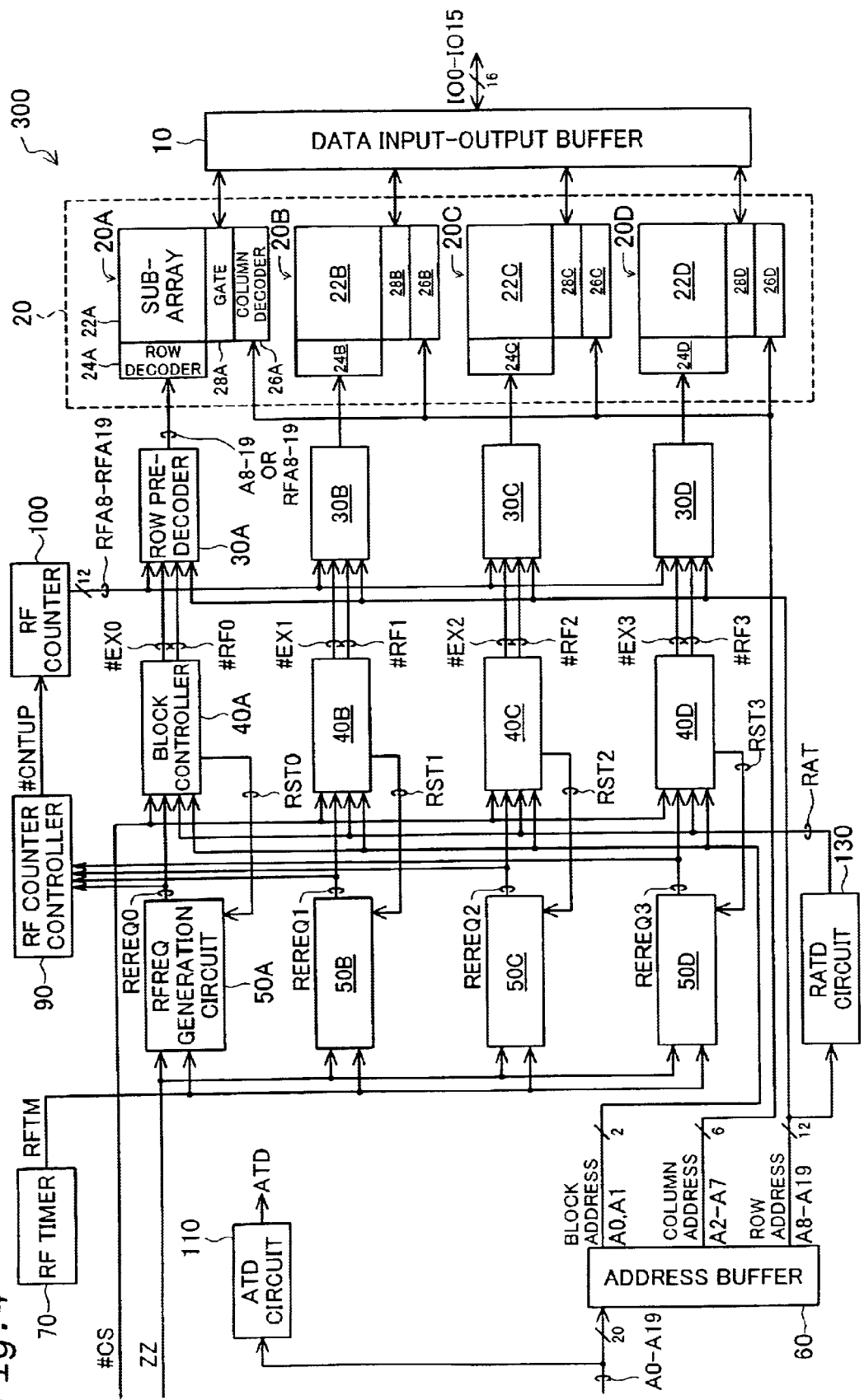

| MODE | TEST | FUSE | STATE |
|---|---|---|---|
| TEST | H | L | ON |
|  | L | L | OFF |
| OPERATION | L | L | ON |
|  | L | H | OFF |

OPERATION CONTROL ACCORDING TO TEMPERATURE VARIATION IN INTEGRATED CIRCUIT

BACKGROUND OF THE INVENTION

1. Field of the Invention

The present invention relates to operation control according to the temperature variation in an integrated circuit.

2. Description of the Related Art

Typical examples of the semiconductor memory device include DRAM and SRAM. As is well known, the DRAM is more affordable in price and has a larger capacity than the SRAM, but requires the refreshing operation. The SRAM does not require any refreshing operation and is easily handled, but is more expensive and has a smaller capacity than the DRAM.

A virtual SRAM (called VSRAM or PSRAM) is known as a semiconductor memory device having the advantages of the DRAM and the SRAM. The virtual SRAM has a memory cell array of dynamic memory cells like the DRAM, and includes a refresh controller to perform the internal refreshing operation. An external device (for example, a CPU) connecting with the virtual SRAM can thus gain access to the virtual SRAM (for reading or writing data) without being specifically conscious of the refreshing operation.

The semiconductor memory device is mounted on diverse electronic apparatuses, for example, cellular phones.

An expensive SRAM is generally used for the semiconductor memory device mounted on the cellular phone, because of the problem discussed below. The semiconductor memory device mounted on the cellular phone is required to attain low power consumption and have a low consumption level of electric current in standby state. The DRAM and the virtual SRAM, however, have the electric current consumption of 10 or greater times that of the SRAM, due to the working current for the refreshing operation. The DRAM and the virtual SRAM are accordingly not suitable for the cellular phones. This is the reason why the expensive SRAM is conventionally used for the cellular phone. Development of an inexpensive virtual SRAM having a low-consumption level of electric current equivalent to that of the conventional SRAM has thus been highly demanded.

SUMMARY OF THE INVENTION

The object of the present invention is thus to provide a technique applied for a semiconductor memory device, such as a virtual SRAM, to ensure a low-consumption level of electric current equivalent to that of a conventional SRAM.

In order to attain at least part of the above and the other related objects, the present invention is directed to a semiconductor memory device, which includes: a memory cell array of dynamic memory cells; a refresh control module having a refresh timer, which generates a refresh timing signal used to determine an execution timing of a refreshing operation of the memory cell array, the refresh control module causing the memory cell array to execute the refreshing operation in response to at least the refresh timing signal; a temperature detection module having a temperature sensing element, which includes a specific pn junction area set in a cutoff state out of pn junction areas formed on an identical semiconductor substrate with the memory cell array and outputs a leak current running through the specific pn junction area, the temperature detection module detecting a temperature change of the semiconductor memory device in response to the leak current output from the temperature sensing element; and a temperature characteristic regulation module that regulates a generation period of the refresh timing signal, based on a result of the detection by the temperature detection module.

The refresh period of the memory cell array is determined, depending upon a data holding time of the memory cell. The data holding time is varied with a variation in temperature of the memory cell or specifically with a variation in junction temperature of the pn junction area (pn junction) of a transistor included in the memory cell. The data holding time is shortened with an increase in temperature of the semiconductor memory device and is extended with a decrease in temperature of the semiconductor memory device.

In the semiconductor memory device of the above construction, the leak current output from the temperature sensing element is varied with a variation in temperature of the semiconductor memory device. The refresh period of the memory cell array may thus be regulated according to the leak current. The longer refresh period relatively decreases the frequency of the refreshing operation and thereby reduces the consumption of electric current required for the refreshing operation. Regulation of the refresh period according to the temperature change of the semiconductor memory device thus effectively reduces the consumption of electric current required for the refreshing operation. This attains the low-consumption level of electric current equivalent to that of the conventional SRAM. Here the 'temperature of the semiconductor memory device' represents the junction temperature of the pn junction area (pn junction) included in the memory cell array or the temperature sensing element or the environmental temperature of the semiconductor memory device.

In accordance with one preferable application of the semiconductor memory device, the temperature detection module has multiple temperature sensing elements of different leak currents, and detects the temperature change of the semiconductor memory device based on an output of one temperature sensing element selected among the multiple temperature sensing elements.

This arrangement desirably compensates for the possible difference among the multiple temperature sensing elements.

An active element set in the cutoff state may be used for the specific pn junction area.

The active element is, for example, a transistor or a diode.

The present invention is also directed to an integrated circuit, which includes: a specific circuit; a temperature detection module having a temperature sensing element, which includes a specific pn junction area set in a cutoff state out of pn junction areas formed on an identical semiconductor substrate with the specific circuit and outputs a leak current running through the specific pn junction area, the temperature detection module detecting a temperature change of the integrated circuit in response to the leak current output from the temperature sensing element; and a temperature characteristic regulation module that regulates a specific working characteristic of the specific circuit, based on a result of the detection by the temperature detection module.

In the integrated circuit of the present invention, the leak current output from the temperature sensing element is varied with a variation in temperature of the integrated circuit. The specific working characteristic of the specific circuit may thus be regulated according to the leak current. Here the 'temperature of the integrated circuit' represents the junction temperature of the pn junction area included in the specific circuit or the temperature sensing element or the environmental temperature of the integrated circuit.

In accordance with one preferable application of the integrated circuit, the temperature detection module has multiple temperature sensing elements of different leak currents, and detects the temperature change of the integrated circuit based on an output of one temperature sensing element selected among the multiple temperature sensing elements.

This arrangement desirably compensates for the difference among the multiple temperature sensing elements.

An active element set in the cutoff state may be used for the specific pn junction area.

The active element is, for example, a transistor or a diode.

In one preferable embodiment of the integrated circuit, the specific circuit is an oscillation circuit, and the temperature characteristic regulation module regulates an oscillation period of the oscillation circuit, based on the result of the detection by the temperature detection module.

In another preferable embodiment of the integrated circuit, the specific circuit is a delay circuit, and the temperature characteristic regulation module regulates a delay level of the delay circuit, based on the result of the detection by the temperature detection module.

The oscillation period of the oscillation circuit or the delay level of the delay circuit may be regulated according to the temperature change of the integrated circuit.

The present invention is further directed to a temperature sensing element that detects a temperature change of an integrated circuit. The temperature sensing element includes a specific pn junction area set in a cutoff state out of pn junction areas formed on an identical semiconductor substrate with the integrated circuit and outputs a leak current, which runs through the specific pn junction area and is varied with the temperature change of the integrated circuit.

The temperature sensing element of the present invention detects the temperature change of the integrated circuit.

The technique of the present invention may be actualized by a diversity of applications, for example, a semiconductor memory device, a method of controlling the semiconductor memory device, an electronic apparatus with the semiconductor memory device, an integrated circuit, a method of controlling the integrated circuit, and an electronic apparatus with the integrated circuit.

In the above description, the term 'semiconductor substrate' is not restricted to a silicon (Si) substrate, but includes an insulated substrate with a semiconductor area formed thereon, for example, an SOI (silicon on insulator) substrate and a glass substrate with a semiconductor area formed thereon.

The above and other objects, features, aspects, and advantages of the present invention will become more apparent from the following detailed description of the preferred embodiment with the accompanying drawings.

BRIEF DESCRIPTION OF THE DRAWINGS

FIG. 1 shows the terminal structure of a memory chip 300 in one embodiment of the present invention;

FIG. 2 shows the working status of the memory chip 300 according to the signal levels of a chip select signal #CS and a snooze signal ZZ;

FIGS. 3(A) through (H) are timing charts showing the operations of the memory chip 300;

FIG. 4 is a block diagram illustrating the internal structure of the memory chip 300;

DESCRIPTION OF THE PREFERRED EMBODIMENTS

Figure 5:
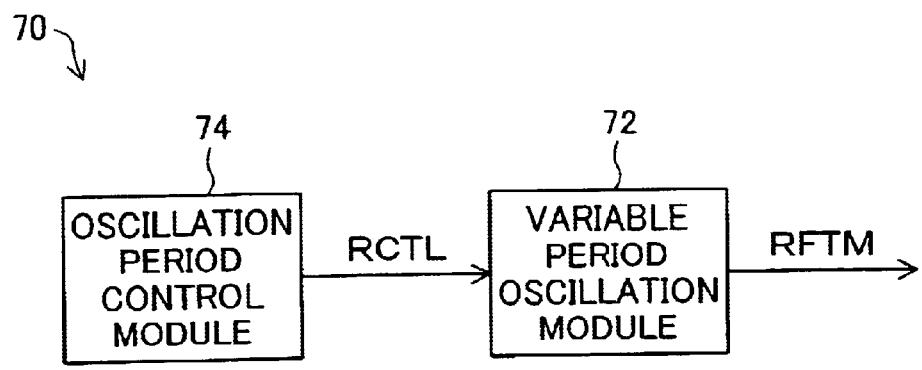
FIG. 5 is a block diagram illustrating the structure of a refresh timer 70 shown in FIG. 4.

One mode of carrying out the present invention is discussed below as a preferred embodiment in the following sequence:

A. Terminal Structure of Memory Chip and Outline of Working Status
B. General Internal Structure of Memory Chip
C. Internal Structure of Refresh Timer
   C1. Variable Period Oscillation Module
   C2. Oscillation Period Control Module
   C3. Regulation of Refresh Period
D. Application to Electronic Apparatus
E. Modifications A. Terminal Structure of Memory Chip and Outline of Working Status FIG. 1 schematically illustrates the terminal structure of a memory chip 300 in one embodiment of the present invention. The memory chip 300 has multiple terminals given below:

A0 through A19: (20) Address input terminals
   #CS: Chip select input terminal
   ZZ: Snooze input terminal
   #WE: Write enable input terminal
   #OE: Output enable input terminal
   #LB: Lower byte enable input terminal
   #UB: Upper byte enable input terminal
   IO0 through IO15: (16) Input-output data terminals In the description hereafter, an identical symbol is assigned commonly for both the terminal name and the signal name. The prefix '#' attached to the head of each terminal name (signal name) represents negative logic. Although there are multiple address input terminals A0 through A19 and input-output data terminals IO0 through IO15, they are simplified in the illustration of FIG. 1.

The memory chip 300 is constructed as a virtual SRAM (VSRAM) that is accessible by the same procedure as that for conventional asynchronous SRAMs. Unlike the SRAM, however, the VSRAM uses dynamic memory cells and requires refreshing in every predetermined time period. A refresh controller including a refresh timer 70 is accordingly built in the memory chip 300. In the specification hereof, data reading and writing operations from an external device (a control device) are referred to as 'external access', and refreshing operations executed by the built-in refresh controller are referred to as 'internal refresh' or simply 'refresh'.

The memory chip 300 is provided with an address transition detection circuit 110, which detects a variation of the input address A0 through A19 by at least one bit. The respective circuits in the memory chip 300 work, based on an address transition signal supplied from the address transition detection circuit 110. For example, adjustment of the external access and the internal refresh is based on the address transition signal. In the description hereinafter, the address transition detection circuit 110 is referred to as the 'ATD circuit', and the address transition signal is referred to as the 'ATD signal'.

The chip select signal #CS and the snooze signal ZZ shown in FIG. 1 are used to regulate the working status of the memory chip 300. FIG. 2 shows the working status of the memory chip 300 according to the signal levels of the chip select signal #CS and the snooze signal ZZ. In the specification hereof, 'level H' denotes a level '1', which is one of two levels of a binary signal, whereas 'level L' denotes a level '0', which is the other of the two levels of the binary signal.

When the chip select signal #CS is at the level L (active) and the snooze signal ZZ is at the level H, a read/write operation cycle is carried out (hereinafter may simply be referred to as 'operation cycle' or 'read/write cycle'). In the operation cycle, external access is permitted, while internal refresh is executed at adequate timings.

When both of the chip select signal #CS and the snooze signal ZZ are at the level H, a stand-by cycle is carried out. In the stand-by cycle, external access is prohibited, and all word lines are inactivated. During the internal refresh, however, a specific word line specified by a refresh address is activated.

When the chip select signal #CS is at the level H (inactive) and the snooze signal ZZ is at the level L, the memory chip 300 shifts into a snooze status (also referred to as 'power-down status'). In the snooze status, all circuits other than those required for the refreshing operation are ceased. The snooze status has extremely small power consumption and is thus suitable for data backup in the memory.

The refreshing operation is executed in a first refresh mode in the operation cycle and in the stand-by cycle, and is executed in a second refresh mode in the snooze status. In the first refresh mode, the refreshing operation starts synchronously with the ATD signal after generation of a refresh timing signal by a refresh timer 70. In the second refresh mode, on the other hand, the refreshing operation starts immediately after generation of the refresh timing signal by the refresh timer 70. The refreshing operation in the second refresh mode is asynchronous with the ATD signal and accordingly does not require input of an address A0 through A19. The memory chip 300 executes refreshing in the suitable refresh mode corresponding to each of the three working statuses. The details of the refreshing operation in these two modes will be discussed later.

The address data A0 through A19 shown in FIG. 1 is 20-bit data and specifies an address of 1 mega word. The input-output data IO0 through IO15 is 16-bit data corresponding to 1 word. Namely each value of the address A0 through A19 corresponds to 16 bits (1 word), and allows simultaneous input or output of the 16-bit input-output data IO0 through IO15.

In the operation cycle, a write cycle is carried out when the write enable signal #WE is at the level L, whereas a read cycle is carried out when the write enable signal #WE is at the level H. Output from the input-output data terminals IO0 through IO15 is allowed when the output enable signal #OE is at the level L. The lower byte enable signal #LB and the upper byte enable signal #UB are control signals for reading or writing only one byte out of the lower byte and the upper byte of 1 word (16 bits). For example, when the lower byte enable signal #LB is set at the level L and the upper byte enable signal #UB is set at the level H, the reading or writing operation is executed for only the lower 8 bits of 1 word. A power terminal is omitted from the illustration of FIG. 1.

FIGS. 3(A) through (H) are timing charts showing the operations of the memory chip 300. The current working status among the three working statuses (operation, stand-by, snooze) shown in FIG. 2 is specified at adequate timings according to variations of the chip select signal #CS and the snooze signal ZZ. The first three cycles in FIG. 3 are in the operation cycle. In the operation cycle, either the read operation (read cycle) or the write operation (write cycle) is executed according to the level of the write enable signal #WE. A minimum period Tc of the ATD signal (that is, a minimum period of the variation of the address A0 through A19) corresponds to a cycle time (also referred to as 'cycle period') of this memory chip 300. The cycle time Tc is set, for example, in a range of about 50 ns to about 100 ns.

At the fourth cycle in FIG. 3, the chip select signal #CS has risen to the level H, so that the stand-by cycle starts. At the fifth cycle, the snooze signal ZZ has fallen to the level L, so that the memory chip 300 shifts to the snooze status. No ATD signal is generated during no variation of the address A0 through A19 as shown in FIG. 3(A).

B. General Internal Structure of Memory Chip

FIG. 4 is a block diagram illustrating the internal structure of the memory chip 300. This memory chip 300 has a data input-output buffer 10, a memory cell array 20, and an address buffer 60.

The memory cell array 20 is divided into four blocks 20A through 20D. The first block 20A has a memory cell sub-array 22A, a row decoder 24A, a column decoder 26A, and a gate 28A. The other blocks 20B through 20D have similar constituents. Since the respective blocks 20A through 20D have substantially the same structure, the following description mainly regards the first block 20A and other circuits related thereto.

The structure of each block 20A is similar to that of a typical DRAM memory cell array. The sub-array 22A has a plurality of one-transistor, one-capacitor-type memory cells arranged in a matrix. Each memory cell is connected with a word line and a bit line pair (also referred to as data line pair). The row decoder 24A includes a row driver and activates selected one of multiple word lines in the sub-array 22A according to a given row address. The column decoder 26A includes a column driver and simultaneously selects bit line pairs of 1 word (16 bits) among multiple bit line pairs in the sub-array 22A according to a given column address. The gate 28A includes a reading circuit and a writing circuit and allows data transmission between the data input-output buffer 10 and the sub-array 22A. The block 20A also includes non-illustrated other constituents, such as a pre-charge circuit and a sense amplifier.

The address buffer 60 is a circuit for supplying a 20-bit address A0 through A19 transmitted from an external device to the other internal circuits. The lower-most 2-bit address A0 and A1 specifies a block address for selecting one among the four blocks 20A through 20D. The 6-bit address A2 through A7 upper than the block address A0 and A1 specifies a column address, and the upper-most 12-bit address A8 through A19 specifies a row address. The block address A0 and A1 selects one of the four blocks 20A through 20D, and the column address A2 through A7 and the row address A8 through A19 select memory cells of 1 word (16 bits) in the selected block. Data of 1 word corresponding to the selected memory cells are read or written via the data input-output buffer 10. The external device gains simultaneous access to the memory cells of 1 word in the selected block by input of one address A0 through A19.

Row pre-decoders 30A through 30D, block controllers 40A through 40D, and refresh requirement signal generation circuits 50A through 50D are connected in this sequence to the respective blocks 20A through 20D. The memory chip 300 also includes the refresh timer 70, a refresh counter controller 90, a refresh counter 100, the ATD (address transition detection) circuit 110, and a row address transition detection (RATD) circuit 130.

The ATD circuit 110 detects a variation of the 20-bit address A0 through A19 given from the external device by at least one bit, and generates the ATD signal as shown in FIG. 3(A) in response to the detected variation.

The refresh timer 70 shown in FIG. 4 is a circuit of generating a refresh timing signal RFTM at every fixed refresh period described later. The details of the refresh timer 70 will be discussed later.

The refresh requirement signal generation circuits 50A through 50D respectively generate refresh requirement signals RFREQ0 through RFREQ3, which correspond to the respective blocks 20A through 20D, in response to the refresh timing signal RFTM generated by the refresh timer 70. The refresh requirement signals RFREQ0 through RFREQ3 are respectively supplied to the corresponding block controllers 40A through 40D.

The block controllers 40A through 40D receive the block address A0 and A1 given from the external device, as well as the refresh requirement signals RFREQ0 through RFREQ3. The refresh requirement signals RFREQ0 through RFREQ3 require start of the refreshing operation in the corresponding four blocks 20A through 20D. In the operation cycle, the block address A0 and A1 specifies the destination of the required external access among the four blocks 20A through 20D. The block controllers 40A through 40D accordingly adjust the external access and the internal refresh with regard to the four blocks 20A through 20D in response to these refresh requirement signals RFREQ0 through RFREQ3 and the block address A0 and A1. A concrete procedure of the adjustment sets the output levels of external access execution signals #EX0 through #EX3 and refresh execution signals #RF0 through #RF3.

The row pre-decoders 30A through 30D respectively select either one of the row address A8 through A19 given from the external device and a refresh address RFA8 through RFA19 given from the refresh counter 100 according to the levels of the external access execution signals #EX0 through #EX3 and the refresh execution signals #RF0 through #RF3, and supply the selected address to the row decoders 24A through 24D. Each row pre-decoder independently carries out the selection out of the two addresses A8 through A19 and RFA8 through RFA19. For example, when requirement of the refreshing operation is given with the requirement of external access to the first block 20A, the first row pre-decoder 30A selects the row address A8 through A19 and supplies the selected row address A8 through A19 to the first block 20A, while the other row pre-decoders 30B through 30D respectively select the refresh address RFA8 through RFA19 and supply the selected refresh address RFA8 through RFA19 to the corresponding blocks 20B through 20D. The first row pre-decoder 30A supplies the refresh address RFA8 through RFA19 to the first block 20A after conclusion of the external access to the first block 20A.

The refresh counter controller 90 detects conclusion of the refreshing operation in all of the four blocks 20A through 20D according to the same refresh address RFA8 through RFA19. The detection is implemented by checking the variation in signal level of the four refresh requirement signals RFREQ0 through RFREQ3. On conclusion of the refreshing operation in the four blocks 20A through 20D, the refresh counter controller 90 supplies a count up signal #CNTUP to the refresh counter 100. The refresh counter 100 counts up the value of the refresh address RFA8 through RFA19 by one in response to this count up signal #CNTUP.

The memory chip 300 has a controller for controlling the working status of the internal circuits in response to the chip select signal #CS and the snooze signal ZZ and a controller for controlling the input and output status in response to the various enable signals #WE, #OE, #UB, and #LB, in addition to the circuit elements shown in FIG. 4, although they are omitted from the illustration of FIG. 4 as a matter of convenience.

The circuit elements (30A through 30D, 40A through 40D, 50A through 50D, 70, 90, 100, 110, and 130) other than the data input-output buffer 10, the address buffer 60, and the memory cell array 20 in FIG. 4 exert the functions of the refresh control module of the present invention.

In the above description, A0 and A1, A2 through A7, and A8 through A19 out of the address A0 through A19 respectively specify the block address, the column address, and the row address. This setting is, however, not at all restrictive. The combination of the row address, the column address, and the block address may be set arbitrarily.

C. Internal Structure of Refresh Timer

FIG. 5 is a block diagram illustrating the structure of the refresh timer 70 shown in FIG. 4. The refresh timer includes a variable period oscillation module 72 and an oscillation period control module 74.

The variable period oscillation module 72 generates the refresh timing signal RFTM, which represents a refresh period trf. The refresh period trf is set in response to a control signal RCTL supplied from the oscillation period control module 74 as discussed later.

The variable period oscillation module 72 and the oscillation period control module 74 are discussed below.

C1. Variable Period Oscillation Module

Figure 6:
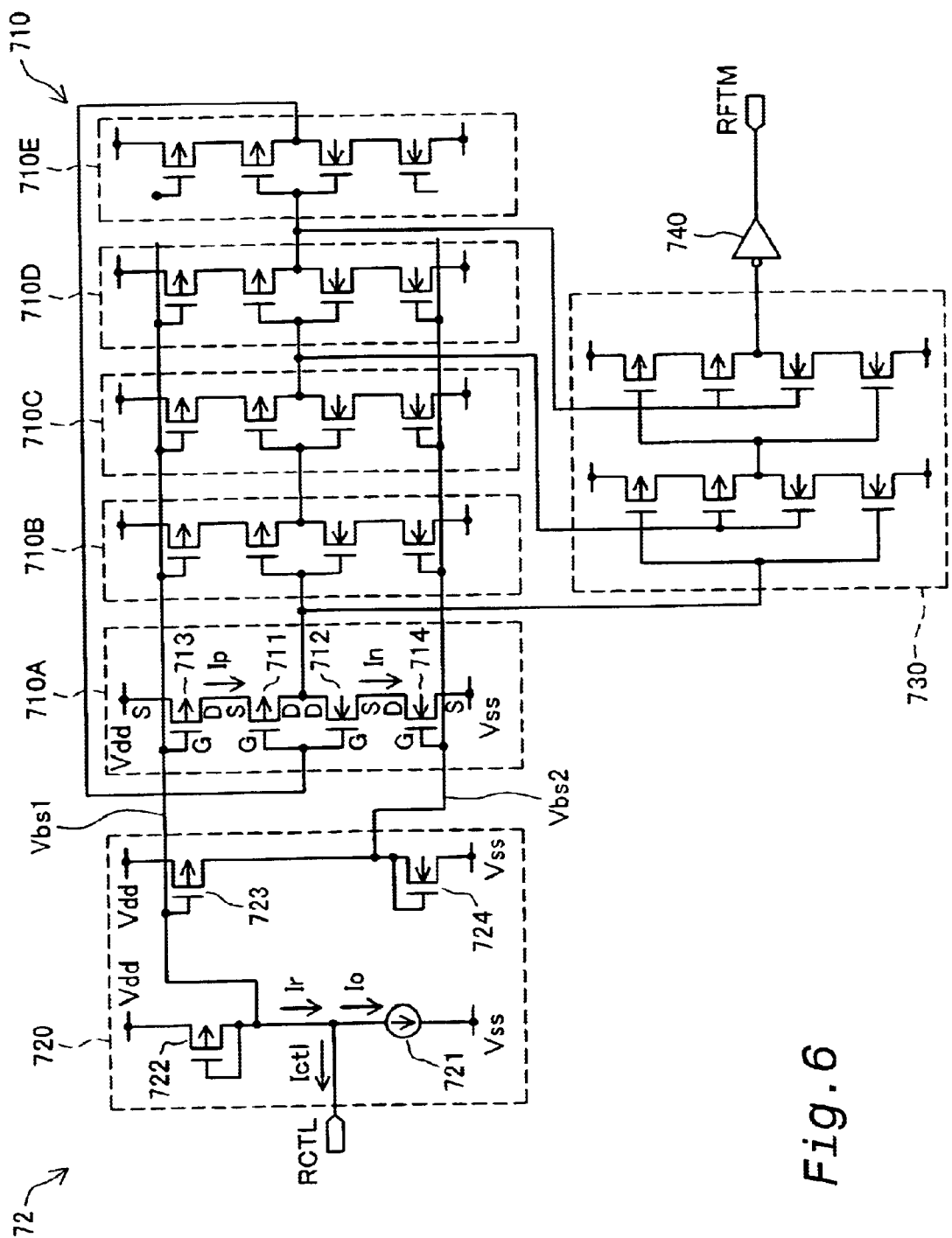
FIG. 6 is a circuit diagram schematically illustrating the internal structure of a variable period oscillation module 72.

FIG. 6 is a circuit diagram schematically illustrating the internal structure of the variable period oscillation module 72. The variable period oscillation module 72 includes a ring oscillator 710 having five inverters 710A through 710E. The five inverters 710A through 710E have an identical circuit structure, and the following description thus mainly regards the first inverter 710A.

The first inverter 710A is a CMOS inverter including one set of a p-channel MOS transistor (hereafter referred to as 'pMOS') 711 and an n-channel MOS transistor (hereafter referred to as 'nMOS') 712. The source (S) of the pMOS 711 is provided with a pMOS 713 as an electric current source for supplying a driving current to the pMOS 711 (hereafter may be referred to as 'electric current source 713'). The source (S) of the nMOS 712 is provided with an nMOS 714 as an electric current source for supplying a driving current to the nMOS 712 (hereinafter may be referred to as 'electric current source 714').

A bias voltage Vbs1 is applied from a bias circuit 720 to the gate (G) of the pMOS 713 as the electric current source to specify the driving current. In a similar manner, a bias voltage Vbs2 is applied from the bias circuit 720 to the gate (G) of the nMOS 714 as the electric current source.

A constant current source 721 and a pMOS 722 connecting with the constant current source 721 in the bias circuit 720 and the pMOS 713 as the electric current source of the first inverter 710A constitute a current mirror circuit. In this current mirror circuit, a driving current Ip output from the pMOS 713 is expressed as Ip=M1·Ir, where Ir denotes a working current running through the pMOS 722 in the bias circuit 720 and M1 represents a mirror coefficient in the current mirror circuit. The mirror coefficient M1 is specified as the rate of a gate dimension ratio (a ratio of the gate width to the gate length) of the pMOS 713 as the electric current source to a gate dimension ratio of the pMOS 722 in the bias circuit 720.

The constant current source 721, the pMOS 722 and another pMOS 723 connecting with the constant current source 721, and an nMOS 724 connecting with the pMOS 723 in the bias circuit 720 and the nMOS 714 as the electric current source of the first inverter 710 also constitute a current mirror circuit. In this current mirror circuit, a driving current In output from the nMOS 714 is expressed as In=M2·Ir, where M2 represents a mirror coefficient in the current mirror circuit. The mirror coefficient M2 is specified as the product of the rate of a gate dimension ratio of the pMOS 723 to the gate dimension ratio of the pMOS 722 in the bias circuit 720 and the rate of a gate dimension ratio of the nMOS 714 as the electric current source to a gate dimension ratio of the nMOS 724 in the bias circuit 724.

The driving currents Ip and In of the first inverter 710A are accordingly varied with a variation in working current Ir of the pMOS 722 in the bias circuit 720. Namely the driving currents Ip and In increase with an increase in working current Ir and decrease with a decrease in working current Ir.

The working speed of the first inverter 710A or a delay time td depends upon the driving currents Ip and In. The delay time td is shortened with an increase of the driving currents Ip and In and is extended with a decrease of the driving currents Ip and In.

The delay time td of the first inverter 710A is accordingly varied with a variation in working current Ir running through the pMOS 722 in the bias circuit 720. The delay time td in the second through the fifth inverters 710B through 710E also depend upon the working current Ir.

An oscillation period tosc of the ring oscillator 710 is expressed as tosc=2·(5·td), where td represents the delay time in each of the first through the fifth inverters 710A through 710E. As discussed above, the delay time td in each of the inverters 710A through 710E depends upon the working current Ir of the pMOS 722 in the bias circuit 720. The oscillation period tosc of the ring oscillator 710 is thus varied with a variation in working current Ir of the pMOS 722.

The working current Ir of the pMOS 722 is expressed as the sum of a control current Ict1 as the control signal RCTL and a constant current Io output from the constant current source 721. The working current Ir of the pMOS 722 is accordingly varied with a variation in control current Ict1. The oscillation period tosc of the ring oscillator 710 is thus set according to the control current Ict1.

The oscillation signal generated by the ring oscillator 710 is output as the refresh timing signal RFTM via a waveform shaping circuit 730 and an output inverter 740. The refresh period trf accordingly corresponds to the oscillation period tosc of the ring oscillator 710.

The waveform shaping circuit 710 has the function of improving the rising characteristics and the falling characteristics of the oscillation signal generated by the ring oscillator 710. This function suppresses an inverter pass current flowing through the output inverter 740.

C2. Oscillation Period Control Module

Figure 7:
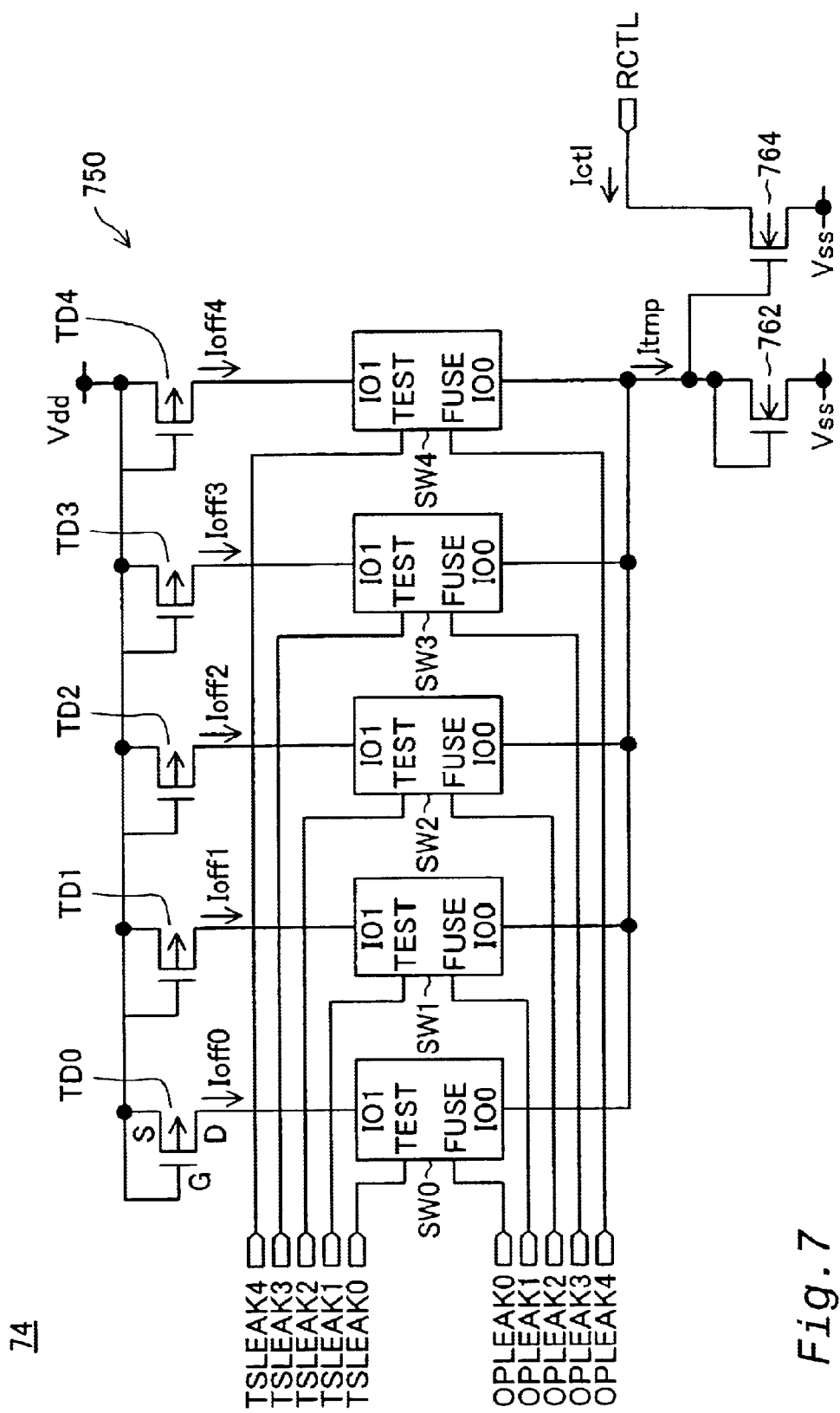
FIG. 7 is a circuit diagram schematically illustrating the internal structure of an oscillation period control module 74.

FIG. 7 is a circuit diagram schematically illustrating the internal structure of the oscillation period control module 74. The oscillation period control module 74 includes a temperature detector 750 and a control signal output unit 760.

The temperature detector 750 includes five temperature sensing elements TD0 through TD4 and five switch circuits SW0 through SW4 corresponding to the respective temperature sensing elements TD0 through TF4. Each of the temperature sensing elements TD0 through TD4 is constructed as a pMOS of a different design dimension of the gate length. The gate (G) and the source (S) of the pMOS in each of the temperature sensing elements TD0 through TD4 are connected to a higher-voltage power source Vdd out of two power sources Vdd and Vss. In the pMOS of each of the temperature sensing elements TD0 through TD4, no voltage in a forward direction is applied to a pn junction between the source (S) and the gate (G), and the pn junction is in a cutoff state. The cutoff state may be attained by applying a higher voltage to the gate (G) than the voltage applied to the source (S), that is, by applying a voltage in a reverse direction to the pn junction between the source (S) and the gate (G). The drain (D) of the pMOS in each of the temperature sensing elements TD0 through TD4 is connected to an input 101 of corresponding one of the switch circuits SW0 through SW4. Outputs IO0 of the respective switch circuits SW0 through SW4 are connected with one another and with the control signal output unit 760.

The first switch circuit SW0 receives inputs of two switch signals TSLEAK0 and OPLEAK0. Similarly the second through the fifth switch circuits SW1 through SW4 respectively receive two switch signals TSLEAK1 and OPLEAK1 through TSLEAK4 and OPLEAK4. These switch signals TSLEAK0 through TSLEAK4 and OSLEAK0 through OSLEAK4 are output from a non-illustrated switch signal generation unit in respective modes discussed below.

Figures 8A, 8B:
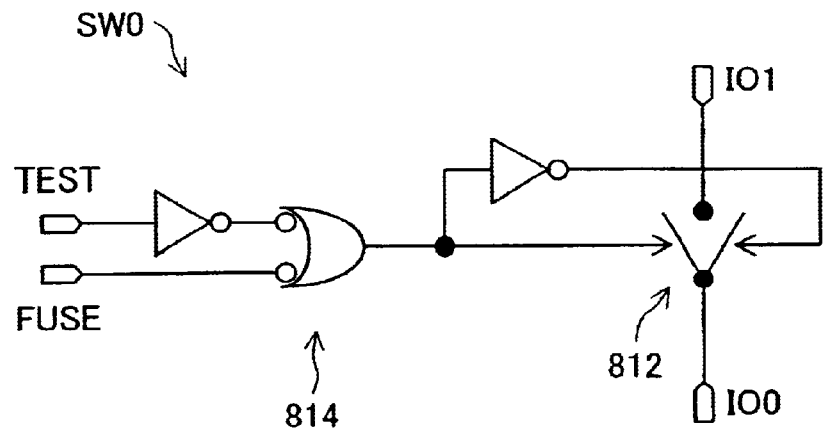
FIGS. 8(A) and (B) show a first switch circuit SW0.

FIGS. 8(A) and (B) show the first switch circuit SW0. The switch circuit SW0 includes a switch 812 and a switch controller 814 as shown in FIG. 8(A). In this first switch circuit SW0, the status of the switch 812 is regulated according to the signal levels of the first test mode switch signal TSLEAK0 input into a TEST terminal and the first operation mode switch signal OPLEAK0 input into a FUSE terminal as shown in FIG. 8(B). In a test mode, the FUSE terminal is set at the level L by the first operation mode switch signal OPLEAK0. The status of the switch 812 is controllable according to the level of the TEST terminal in response to the first test mode switch signal TSLEAK0. Specifically, the switch 812 is set in ON state at the level H of the TEST terminal and is set in OFF state at the level L of the TEST terminal. In an operation mode, on the other hand, the TEST terminal is set at the level L by the first test mode switch signal TSLEAK0. The status of the switch 812 is controllable according to the level of the FUSE terminal in response to the first operation mode switch signal OPLEAK0. Specifically, the switch 812 is in OFF state at the level H of the FUSE terminal and is set in ON state at the level L of the FUSE terminal.

The second through the fifth switch circuits SW1 through SW4 are similarly constructed and operated. In the test mode, one of the test mode switch signals TSLEAK0 through TSLEAK4 is set at the level H, while the operation mode switch signals OPLEAK0 through OPLEAK4 input into the five switch circuits SW0 through SW4 are all set at the level L. This makes the corresponding switch circuit in ON state. In the operation mode, on the other hand, one of the operation mode switch signals OPLEAK0 through OPLEAK4 is set at the level L, while the test mode switch signals TSLEAK0 through TSLEAK4 input into the five switch circuits SW0 through SW4 are all set at the level L. This makes the corresponding switch circuit in ON state.

In the temperature detector 750 shown in FIG. 7, one of the five temperature sensing elements TD0 through TD4 is selected by the corresponding one of the switch circuit SW0 through SW4 as described above. The selected temperature sensing element outputs a leak current Ioff (one of leak currents Ioff0 through Ioff4).

The leak current Ioff depends upon an environmental temperature Ta of the memory chip 300 (specifically a junction temperature Tj of the pn junction (the pn junction area) set in the cutoff state of the temperature sensing element). The leak current Ioff increases with an increase in environmental temperature Ta and decreases with a decrease in environmental temperature Ta. The leak current Ioff is output as a temperature detection current Itmp corresponding to a temperature detection signal from the temperature detector 750. The temperature detection current Itmp as the temperature detection signal is input into the control signal output module 760.

The control signal output module 760 is a current mirror circuit including two nMOSes 762 and 764. The control current Ict1 as the control signal RCTL output from the control signal output module 760 is expressed as Ict1=M3·Itmp, where M3 represents a mirror coefficient in the current mirror circuit and is specified as the rate of a gate dimension ratio of the second nMOS 764 to a gate dimension ratio of the first nMOS 762.

As described above, the temperature detection current Itmp, which determines the control current Ict1, corresponds to the leak current Ioff of the temperature sensing element selected in the temperature detector 750. The control current Ict1 determined by the temperature detection current Itmp is thus varied with a variation in environmental temperature Ta. Namely the control current Ict1 increases with an increase in environmental temperature Ta and decreases with a decrease in environmental temperature Ta. The oscillation period tosc of the variable period oscillation module 72 or the refresh period trf is varied according to the control current Ict1. The refresh period trf is thus varied with a variation in environmental temperature Ta. The refresh period trf is shortened with an increase in environmental temperature Ta and is extended with a decrease in environmental temperature Ta. The relationship between the environmental temperature Ta and the refresh period trf will be discussed in detail later.

As mentioned above, the control current Ict1 is the parameter for setting the oscillation period tosc of the variable period oscillation module 72 or the refresh period trf. The high accuracy of the control current Ict1 is desired, in order to attain the highly accurate periodic signal.

The leak current Ioff of the pMOS as the temperature sensing element, which is the parameter determining the control current Ict1, may be deviated significantly from the designed value with a variation in manufactured gate length of the pMOS. This leads to a significant variation in value of the control current Ict1 determined by this leak current Ioff and causes the refresh period trf to be deviated remarkably from the designed value.

With a view to enhancing the accuracy of the refresh period trf, the temperature detector 750 of the embodiment uses the five temperature sensing elements TD0 through TD4 having different design dimensions of the gate length and is capable of selecting the optimum temperature sensing element.

Selection of the optimum temperature sensing element may follow the procedure discussed below.

In the test mode, the procedure successively sets the test mode switch signals TSLEAK0 through TSLEAK4 at the level H, while setting the operation mode switch signals OPLEAK0 through OPLEAK4 at the level L, so as to select the five temperature sensing elements TD0 through TD4 sequentially. The procedure then checks the oscillation period tosc of the variable period oscillation module 72 or the refresh period trf to determine the optimum temperature sensing element. In the actual operation mode, the procedure sets only the operation mode switch signal corresponding to the optimum temperature sensing element determined in the test mode at the level L and fixes the other operation mode switch signals at the level H, among the operation mode switch signals OPLEAK0 through OPLEAK4, while setting the test mode switch signals TSLEAK0 through TSLEAK4 at the level L. This procedure effectively prevents the variation in refresh period trf.

C3. Regulation of Refresh Period

The refreshing operation is carried out to hold the data stored in each memory cell. The refresh period trf is accordingly set to be an interval of not longer than a data holding time tch, for which data stored in each memory cell can be held. In the following description, for simplicity of explanation, it is assumed that the refresh period trf is in principle set equal to the data holding time tch.

Figure 9:
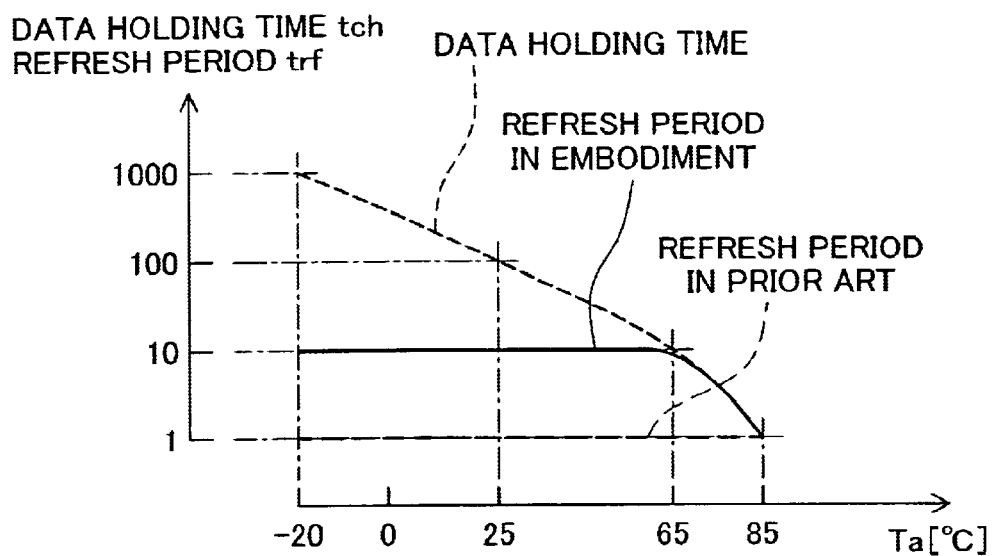
FIG. 9 is a graph showing a data holding time tch in a range of a working environmental temperature Ta from −20° C. to 85° C.

FIG. 9 is a graph showing the data holding time tch in a range of the working environmental temperature Ta from −20° C. to 85° C. In the graph of FIG. 9, the value of the data holding time tch is set equal to 1 at the maximum environmental temperature Ta=85° C. As shown in FIG. 9, the data holding time tch is extended to approximately 10 times at the environmental temperature Ta=65° C., to approximately 100 times at Ta=25° C., and to approximately 1,000 times at Ta=−20° C., compared with the data holding time tch at Ta=85° C. This shows that the refresh period trf may be varied according to the environmental temperature Ta.

In many cases, in order to ensure the stable operations, the actual environmental temperature Ta, at which the memory works, is set to be lower than the maximum applicable environmental temperature Ta. For example, the actual environmental temperature Ta is set to be not higher than 65° C. In this case, the data holding time tch in the environmental temperature range of Ta≦65° C. is extended to be more than 10 times of the data holding time tch at the environmental temperature Ta=85° C. as shown in the graph of FIG. 9. The refresh period trf in this temperature range Ta≦65° C. can thus be set to be at least 10 times longer than the refresh period trf at the environmental temperature Ta=85° C. In the description below, the refresh period trf set at the environmental temperature Ta=85° C. may be referred to as the 'minimum refresh period trf(min)'.

The refresh period trf of the prior art memory chip is set to a fixed period that is not longer than the data holding time tch at the maximum environmental temperature Ta, in order to enable data to be held over the applicable range of the environmental temperature Ta.

The refresh period trf specified by the refresh timing signal RFTM output from the variable period oscillation module 72 (see FIG. 6) in the refresh timer 70 of the embodiment is, on the other hand, varied with a variation in environmental temperature Ta as discussed above. The refresh period trf is shortened with an increase in environmental temperature Ta and is extended with a decrease in environmental temperature Ta. This variation is similar to the variation of the data holding time tch.

The data holding time tch depends upon the leak current in the cutoff state of the transistor included in the memory cell. The leak current of the transistor is varied with a variation in environmental temperature Ta or specifically the junction temperature Tj of the pn junction of the transistor. As mentioned previously, the refresh period trf also depends upon the leak current Ioff output from the temperature sensing element of the temperature detector 750. The technique of the embodiment thus varies the refresh period trf according to the data holding time tch, which is varied with a variation in environmental temperature Ta as shown in FIG. 9.

In the embodiment, the refresh period trf is regulated to have a substantially fixed value in the actual working range of the environmental temperature Ta≦65° C. as shown in FIG. 9. This is, however, not restrictive in any sense. The refresh period trf may be varied with a variation in environmental temperature Ta. The characteristic variation of the refresh period trf is specified by the ratio of the control current Ict1 to the constant current Io included in the working current Ir of the pMOS 722 in the bias circuit 720 of the variable period oscillation module 72 (see FIG. 6).

The refresh period trf is shortened with an increase in environmental temperature Ta, and is extended with a decrease in environmental temperature Ta. The decrease in environmental temperature Ta lowers the frequency of the refreshing operation per unit time and thereby reduces an electric current consumption Irf required for the refreshing operation. Namely the electric current consumption Irf for the refreshing operation is substantially inversely proportional to the refresh period trf. The variation in refresh period trf according to the data holding time tch corresponding to the environmental temperature Ta thus lowers the electric current consumption required for the refreshing operation.

Figure 10:
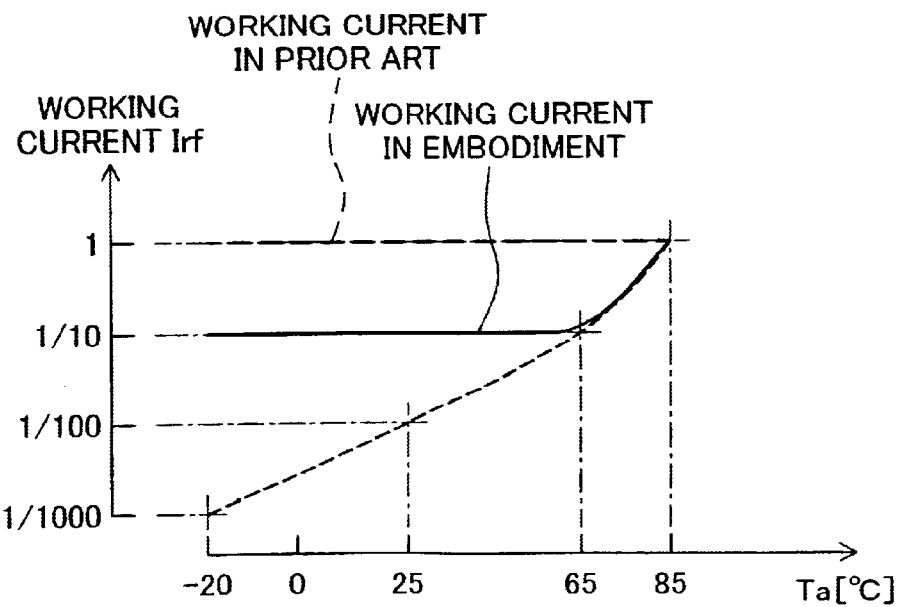
FIG. 10 is a graph showing an electric current consumption Irf at a refresh period trf of the embodiment shown in FIG. 9.

FIG. 10 is a graph showing the electric current consumption Irf at the refresh period trf of the embodiment shown in FIG. 9. In the graph of FIG. 10, the value of the electric current consumption Irf is set equal to 1 at the maximum environmental temperature Ta=85° C. As shown in FIG. 10, the level of the electric current consumption Irf in a temperature range Ta≦65° C. is almost ⅒ of the electric current consumption Irf at the maximum environmental temperature Ta=85° C.

In the embodiment, the electric current consumption Irf for the refreshing operation is substantially constant in the temperature range of Ta≦65° C., because the refresh period trf is regulated to be constant in the temperature range of Ta≦65° C. as shown in FIG. 9. When the control procedure allows a variation in refresh period trf with the varying data holding time tch of FIG. 9 even in the temperature range of Ta<65° C., the electric current consumption Irf for the refreshing operation may be varied accordingly. This procedure also effectively reduces the level of the electric current consumption Irf to approximately ⅒ of the conventional level.

As described above, in the memory chip 300 of the embodiment, the refresh period trf in response to the refresh timing signal RFTM generated by the refresh timer 70 is regulated to an approximate length according to the data holding time tch of the memory cell corresponding to the environmental temperature Ta. This arrangement effectively reduces the level of the electric current consumption Irf for the refreshing operation in the actual working range of the environmental temperature Ta.

The characteristics of the refresh period trf shown in the graph of FIG. 9 and the electric current consumption Irf for the refreshing operation shown in the graph of FIG. 10 are only illustrative and not restrictive in any sense. These characteristics may be varied according to the properties of the semiconductor device and the circuit structure. In any case, however, the technique of the embodiment enables regulation of the refresh period trf according to the data holding time tch corresponding to the environmental temperature Ta.

D. Application to Electronic Apparatus

Figure 11:
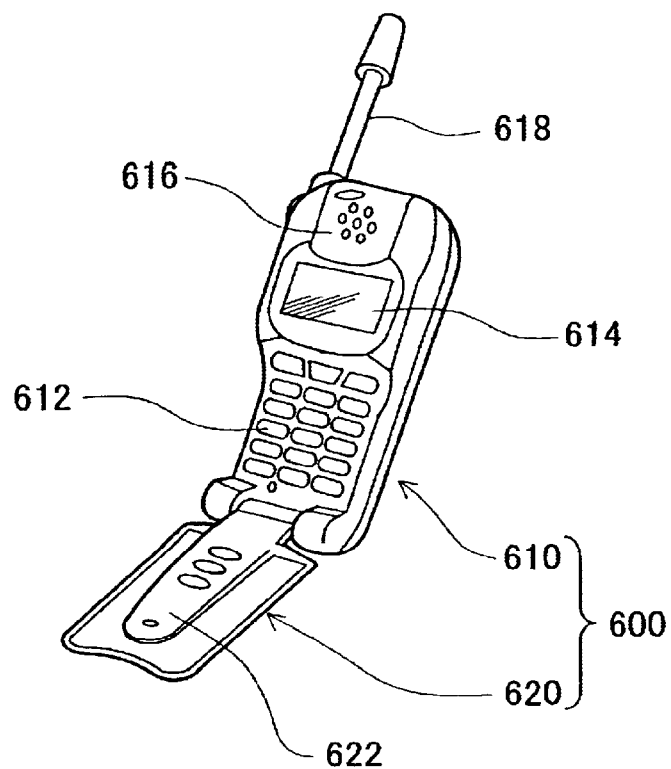
FIG. 11 is a perspective view illustrating a cellular phone 600 as one application of a semiconductor device of the present invention to an electronic apparatus.

FIG. 11 is a perspective view illustrating a cellular phone 600 as one application of a semiconductor device of the present invention to an electronic apparatus. The cellular phone 600 has a main body 610 and a cover member 620. The main body 610 has a keyboard 612, a liquid crystal display 614, a receiver module 616, and an aerial module 618. The cover member 620 has a microphone module 622.

Figure 12:
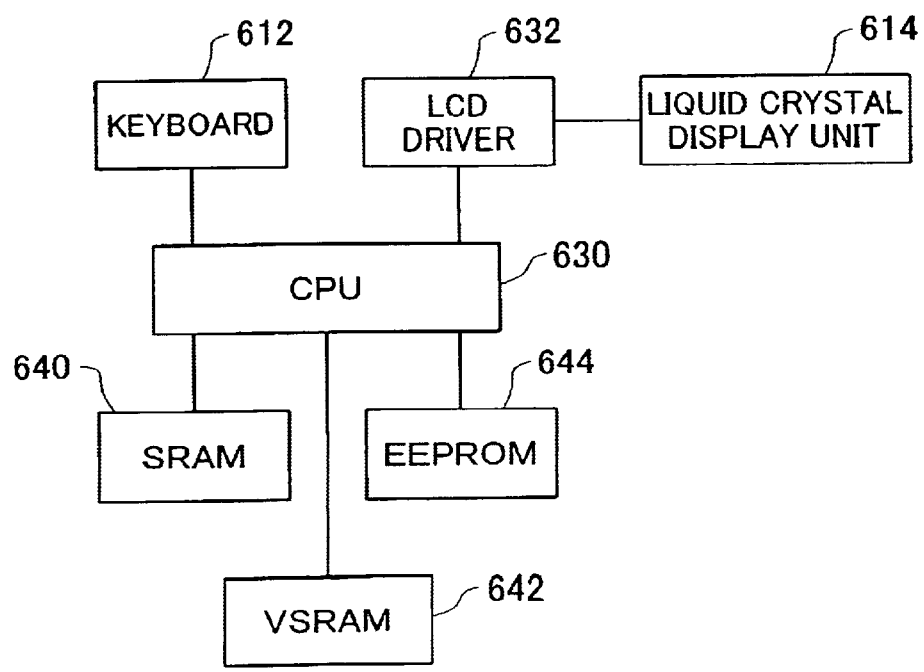
FIG. 12 is a block diagram illustrating the electrical construction of the cellular phone 600 shown in FIG. 11.

FIG. 12 is a block diagram illustrating the electrical construction of the cellular phone 600 shown in FIG. 11. A CPU 630 is connected to the keyboard 612, an LCD driver 632 for actuating the liquid crystal display 614, an SRAM 640, a VSRAM 642, and an EEPROM 644 via bus lines.

The SRAM 640 is used, for example, as a high-speed cache memory. The VSRAM 642 is used, for example, as a working memory for image processing. The memory chip 300 described above is applicable for the VSRAM (virtual SRAM) 642. The EEPROM 644 is used to store various settings of the cellular phone 600.

The VSRAM 642 is kept in the snooze state to pause the operations of the cellular phone 600. In this state, the VSRAM 642 automatically carries out internal refresh, so that data in the VSRAM 642 can be held. The memory chip 300 of the embodiment has a relatively large capacity and thus advantageously holds a mass of data, such as image data, for a long time period. The memory chip 300 of the embodiment has the significantly reduced level of the working current for the refreshing operation, compared with the level of the conventional memory chip. The memory chip 300 is thus advantageously applicable to a diversity of electronic apparatuses driven by a battery, such as the cellular phone 600.

E. Modifications

The above embodiment and its application are to be considered in all aspects as illustrative and not restrictive. There may be many modifications, changes, and alterations without departing from the scope or spirit of the main characteristics of the present invention. Some examples of possible modification are given below.

(1) The internal structure of the memory chip 300 of the embodiment is only illustrative and not restrictive in any sense. The technique of the present invention is applicable to a diversity of memory chips (semiconductor memory device) having a refresh control module.

(2) In the above embodiment, the memory chip 300 has the ATD circuit (see FIG. 4) and utilizes the ATD signal as the clock signal. The clock signal may alternatively be supplied from an external device. Further possible modification selects either the internal ATD signal or the external clock signal.

(3) In the embodiment discussed above, the variable period oscillation module 72 is constructed as a ring oscillator. This is, however, not restrictive in any sense. The variable period oscillation module 72 may be any oscillation means having a variable period. One applicable structure includes an oscillator of a fixed period and a frequency divider of a variable division rate. In this structure, the division rate corresponding to a required oscillation period is set in response to a temperature change.

(4) In the embodiment discussed above, the procedure detects the temperature change of the memory chip 300 and regulates the refresh period according to the observed temperature change. The technique of the present invention is applicable to regulate a working characteristic of a specific circuit in various other integrated circuits. For example, the present invention is applicable to an integrated circuit including an oscillation circuit. The procedure detects a temperature change of the integrated circuit based on an output (leak current) of the temperature sensing element and regulates the oscillation period of the oscillation circuit according to the result of the detection. Regulation of the oscillation period may vary the oscillation period with the temperature change or fix the oscillation period regardless of the temperature change. In another example, the present invention is applicable to an integrated circuit including a delay circuit. The procedure detects a temperature change of the integrated circuit based on an output of the temperature sensing element and regulates the delay level of the delay circuit according to the result of the detection. Regulation of the delay level may vary the delay level with the temperature change or fix the delay level regardless of the temperature change. In the specification hereof, the term 'temperature of the integrated circuit' represents the junction temperature $T_j$ of a pn junction (pn junction area) in the integrated circuit or the environmental temperature $T_a$ of the integrated circuit.

(5) In the embodiment discussed above, the p-channel MOS transistor set in the cutoff state is used for the temperature sensing element, and the leak current in the pn junction area in the cutoff state is utilized as the temperature detection signal. This is, however, not restrictive in any sense. For example, the temperature sensing element may be any of diverse transistors set in the cutoff state, for example, an n-channel MOS transistor, an NPN transistor, and a PNP transistor. A diode set in the cutoff state may alternatively be used for the temperature sensing element. Namely any of diverse pn junctions set in the cutoff state is applicable for the temperature sensing element.

The scope and spirit of the present invention are indicated by the appended claims, rather than by the foregoing description.

What is claimed is:

1. A semiconductor memory device, comprising:
a memory cell array of dynamic memory cells;
a refresh control module having a refresh timer, which generates a refresh timing signal used to determine an execution timing of a refreshing operation of the memory cell array, the refresh control module causing the memory cell array to execute the refreshing operation in response to at least the refresh timing signal;
a temperature detection module having a temperature sensing element, which includes a specific pn junction area set in a cutoff state out of pn junction areas formed on an identical semiconductor substrate with the memory cell array and outputs a leak current running through the specific pn junction area, the temperature detection module detecting a temperature change of the semiconductor memory device in response to the leak current output from the temperature sensing element; and
a temperature characteristic regulation module that regulates a generation period of the refresh timing signal, based on a result of the detection by the temperature detection module.

2. The semiconductor memory device in accordance with claim 1, wherein the temperature detection module has multiple temperature sensing elements of different leak currents, and detects the temperature change of the semiconductor memory device based on an output of one temperature sensing element selected among the multiple temperature sensing elements.

3. The semiconductor memory device in accordance with claim 1, wherein an active element set in the cutoff state is used for the specific pn junction area.

4. The semiconductor memory device in accordance with claim 3, wherein the active element is either one of a transistor and a diode.

5. The semiconductor memory device in accordance with claim 2, wherein an active element set in the cutoff state is used for the specific pn junction area.

6. The semiconductor memory device in accordance with claim 5, wherein the active element is either one of a transistor and a diode.

7. An integrated circuit, comprising:
a specific circuit;
a temperature detection module having a temperature sensing element, which includes a specific pn junction area set in a cutoff state out of pn junction areas formed on an identical semiconductor substrate with the specific circuit and outputs a leak current running through the specific pn junction area, the temperature detection module detecting a temperature change of the integrated circuit in response to the leak current output from the temperature sensing element; and
a temperature characteristic regulation module that regulates a specific working characteristic of the specific circuit, based on a result of the detection by the temperature detection module.

8. The integrated circuit in accordance with claim 7, wherein the temperature detection module has multiple temperature sensing elements of different leak currents, and detects the temperature change of the integrated circuit based on an output of one temperature sensing element selected among the multiple temperature sensing elements.

9. The integrated circuit in accordance with claim 7, wherein an active element set in the cutoff state is used for the specific pn junction area.

10. The integrated circuit in accordance with claim 9, wherein the active element is either one of a transistor and a diode.

11. The integrated circuit in accordance with claim 8, wherein an active element set in the cutoff state is used for the specific pn junction area.

12. The integrated circuit in accordance with claim 11, wherein the active element is either one of a transistor and a diode.

13. The integrated circuit in accordance with 7, wherein the specific circuit is an oscillation circuit, and
the temperature characteristic regulation module regulates an oscillation period of the oscillation circuit, based on the result of the detection by the temperature detection module.

14. The integrated circuit in accordance with 8, wherein the specific circuit is an oscillation circuit, and
the temperature characteristic regulation module regulates an oscillation period of the oscillation circuit, based on the result of the detection by the temperature detection module.

15. The integrated circuit in accordance with 7, wherein the specific circuit is a delay circuit, and the temperature characteristic regulation module regulates a delay level of the delay circuit, based on the result of the detection by the temperature detection module.

16. The integrated circuit in accordance with 8, wherein the specific circuit is a delay circuit, and the temperature characteristic regulation module regulates a delay level of the delay circuit, based on the result of the detection by the temperature detection module.

17. A temperature sensing element that detects a temperature change of an integrated circuit, the temperature sensing element including a specific pn junction area set in a cutoff state out of pn junction areas formed on an identical semiconductor substrate with the integrated circuit and outputting a leak current, which runs through the specific pn junction area and is varied with the temperature change of the integrated circuit.

18. The temperature sensing element in accordance with claim 17, wherein an active element set in the cutoff state is used for the specific pn junction area.

19. The temperature sensing element in accordance with claim 18, wherein the active element is either one of a transistor and a diode.

* * * * *